United States Patent
Ballard et al.

(10) Patent No.: US 8,091,058 B2
(45) Date of Patent: Jan. 3, 2012

(54) METHODS, COMPUTER-READABLE MEDIA AND COMPUTER-IMPLEMENTED TOOLS FOR PRE-ROUTE REPEATER INSERTION

(75) Inventors: James G. Ballard, Palo Alto, CA (US); Yi Wu, Santa Clara, CA (US)

(73) Assignee: Oracle America, Inc., Redwood City, CA (US)

( * ) Notice: Subject to any disclaimer, the term of this patent is extended or adjusted under 35 U.S.C. 154(b) by 478 days.

(21) Appl. No.: 12/324,439

(22) Filed: Nov. 26, 2008

(65) Prior Publication Data

US 2010/0128760 A1 May 27, 2010

(51) Int. Cl.
*G06F 17/50* (2006.01)

(52) U.S. Cl. ........ 716/114; 716/104; 716/105; 716/118; 716/120; 716/124; 716/125; 716/130; 716/131; 716/133

(58) Field of Classification Search .................. 716/104, 716/105, 114, 118, 120, 124–126, 130, 131, 716/133
See application file for complete search history.

(56) References Cited

U.S. PATENT DOCUMENTS

| | | | |
|---|---|---|---|
| 5,648,911 A | 7/1997 | Grodstein et al. | |
| 6,601,222 B1 * | 7/2003 | Mehrotra et al. | 716/115 |
| 6,684,373 B1 | 1/2004 | Bodine et al. | |
| 7,137,097 B1 | 11/2006 | Aji et al. | |
| 7,243,323 B2 | 7/2007 | Williams et al. | |
| 7,669,160 B2 * | 2/2010 | Furnish et al. | 716/119 |
| 2002/0184607 A1 * | 12/2002 | Alpert et al. | 716/15 |
| 2004/0216072 A1 * | 10/2004 | Alpert et al. | 716/13 |
| 2005/0138578 A1 * | 6/2005 | Alpert et al. | 716/2 |
| 2005/0138589 A1 * | 6/2005 | Alpert et al. | 716/10 |
| 2007/0204252 A1 * | 8/2007 | Furnish et al. | 716/10 |
| 2008/0216038 A1 * | 9/2008 | Bose | 716/8 |

FOREIGN PATENT DOCUMENTS

WO    WO2008/021489    2/2008

* cited by examiner

*Primary Examiner* — Sun Lin
(74) *Attorney, Agent, or Firm* — Polsinelli Shughart PC

(57) ABSTRACT

A method of performing a pre-route repeater insertion methodology for at least part of a circuit design may include: partitioning at least part of a circuit design into a plurality of tiles; determining at least one attribute of one or more individual tiles of the plurality of tiles; and determining a repeater solution based at least in part on the determined attributes of the one or more individual tiles. A computer implemented tool for performing a pre-route repeater insertion methodology for at least part of a circuit design may include: a module configured to partition at least part of a circuit design into a plurality of tiles; a module configured to determine at least one attribute of one or more individual tiles of the plurality of tiles; and a module configured to determine a repeater solution based at least in part on the determined attributes of the one or more individual tiles.

20 Claims, 8 Drawing Sheets

METHODS, COMPUTER-READABLE MEDIA AND COMPUTER-IMPLEMENTED TOOLS FOR PRE-ROUTE REPEATER INSERTION

FIELD OF THE INVENTION

Aspects of the present invention relate to circuit design. More particularly, aspects of the present invention relate to optimal repeater insertion for timing purpose in circuit design.

BACKGROUND

Design automation tools for integrated circuits are well known. Such tools are computer-based tools that assist design by automating procedures that would otherwise be performed manually. Such tools may employ various routing algorithms for routing interconnections between circuit components. Most routing tools for cell-based designs begin with the placement of circuit elements, cells and/or cell blocks. Placement may be manual or automated, and may include decisions on where connectors to the circuit elements, cells and/or cell blocks should be located, as well as relative orientations thereof. Various considerations may be taken into account for such decisions, such as circuit compaction/congestion, number of interconnections between components, and the like. In some cases, placement may be partially predetermined by the design of a manufacturer's existing component being employed in the circuit being designed.

After placement, global routing for the circuit design may be performed to logically determine a path for each interconnection between cells in the entire design. Routing decisions may be made based on various constraints within the context provided by the current placement of circuit elements. For example, a constraint may be to incur the shortest total length of interconnect lines between the connectors. Once a global routing has assigned a general flow of interconnect lines, a detailed routing of interconnect lines may be performed to fit the assignments.

A conventional approach to circuit design is to develop a routing solution for routing interconnections between circuit components, and then evaluate the routing solution, for example, using a constraint engine. Portions of the circuit design (nets) that do not meet specified criteria are manually rerouted, and the revised routing solution is evaluated.

Once a satisfactory routing solution has been determined, a repeater solution is then developed to assign repeaters to nets to meet timing (time signals take to travel between components) and slew (transition between voltage levels, e.g., 0 and 1) requirements. The conventional approach to determining a repeater solution is post-route, that is, after full chip routing is completed. Based on the routing topology and wire-class information of the nets, timing analysis may be performed to determine nets that do not meet timing or slew requirements. Such nets are broken up into net segments and, ideally, repeaters are inserted at such points, if available at the locations.

SUMMARY

Post-route repeater solution methodologies involve several technical problems that hinder or even prevent finding an optimal repeater solution. First, there is no guarantee that repeaters will be available at the locations needed to fix a routed net that has timing or slew issues. As such, a repeater solution may require rerouting or "detouring" nets to reach available repeaters. This process is time consuming and potentially complicated as such rerouting may upset other existing routes. Rerouting for a desired repeater solution may not always be possible because route congestion and/or scenic paths (e.g., the long way around) may be created. Thus, such rerouting may adversely affect the quality of route (QoR), that is, the closeness of the route to the constraints. Post-route repeater solution methodologies do not provide a designer with any indication of whether routes are repeater solution friendly. The end result is a less than optimal compromise between repeater solution and QoR.

Another problem with post-route methodologies is that the wire class (type of interconnects, width, thickness, metal) for nets is already determined when the route is complete. To get from one point to another in a specific amount of time, the choice of repeater solution and the wire class of a net is highly interdependent and highly interchangeable. Thus, the choice between repeaters and wire class that may otherwise be leveraged to reach an optimal solution is not available because the route is complete and the wire class is determined. Without the interchange between repeaters and wire class, the repeater solution is likely to be less than optimal. Further, any later upgrade to nets to meet timing may negatively impact QoR.

Also, because the power efficiency of a repeater solution depends on the flexibility allowed for exploiting path slack timing and/or constraints involved, an optimal power solution may not be possible for post-route repeater solutions. Other than for timing critical paths, neither minimum length routing nor minimum repeater solutions are ideal. Post-route repeater solutions tend to focus only on minimum net length during routing. Thus, the post-route repeater solutions do not allow for selection between different route-repeater combinations, but only application of repeater solutions to determined routes.

For larger circuit designs, post-route repeater solutions may involve an unacceptably long computation time. Large distances covered by long nets in such circuit designs create a large solution space where analysis may be complicated.

Various embodiments disclosed herein may provide improved circuit design methods and computer-implemented tools that do not suffer from the foregoing drawbacks associated with post-route repeater solution methodologies. Various embodiments disclosed herein may provide a methodology for finding a repeater solution for a circuit design independently of a detailed route of the circuit design. Thus, various embodiments disclosed herein may involve a pre-route repeater insertion methodology. Such an approach may diminish or even avoid any need for time consuming and complicated rerouting for a repeater solution, as may be required for post-route repeater insertion. Such an approach may also reduce negative impacts on circuit design such as the creation of scenic paths and/or a lower QoR.

Various embodiments disclosed herein may provide a repeater insertion methodology that includes route congestion analysis. Such an approach may reduce congestion in circuit design, for example, by placing routing out of more congested areas to ensure route closure. Such an approach may also simplify subsequent circuit design procedures such as detailed routing and may help ensure faster route closure.

Various embodiments disclosed herein may provide a repeater insertion methodology that utilizes interdependencies among wire class, timing slack and repeater drive strength. For example, various embodiments may allow for leveraging between wire class and timing constraints to find an optimal wire class solution while finding a repeater solution. Also, various embodiments may allow for leveraging a path's timing slack to optimize for power while finding a repeater solution. Such an approach may provide a more optimal repeater solution in terms of timing and/or power.

Various embodiments disclosed herein may provide a pre-route repeater insertion methodology that is able to be employed with pre-existing routes, such as preroute, and repeaters, such as pre-placed repeater banks.

One embodiment may provide a method of performing a pre-route repeater insertion methodology for at least part of a circuit design. The method may include: partitioning at least part of a circuit design into a plurality of tiles; determining at least one attribute of individual tiles of the plurality of tiles; and determining a repeater solution based at least in part on the determined attributes of the individual tiles.

Another embodiment may provide a computer-implemented tool for performing a pre-route repeater insertion methodology for at least part of a circuit design. The tool may include: a module configured to partition at least part of a circuit design into a plurality of tiles; a module configured to determine at least one attribute of individual tiles of the plurality of tiles; and a module configured to determine a repeater solution based at least in part on the determined attributes of the individual tiles.

Yet other embodiments may provide a computer-readable storage medium including stored instructions that, when executed by a computer, cause the computer to perform any of the methods contemplated by this disclosure. Also, other embodiments may provide a computer-readable storage medium including stored instructions as part of any of the computer-implemented tools contemplated by this disclosure.

DETAILED DESCRIPTION OF EMBODIMENTS

Because the post-route repeater solution methodology involves various problems or drawbacks, various embodiments disclosed herein contemplate a pre-route repeater insertion methodology for a circuit design. As used herein, the term "design" is intended to refer to a chip, a partition of a chip, or any other portion that may require routing and repeater solutions.

In general, the methodology may comprise two main phases: an initialization phase in which a repeater data map and a timing graph are initialized; and, a solution computation phase in which iterations among route resource mapping, repeater window constructing, and repeater placing/cell selecting are performed. Although the following description is provided in terms of particular operations as being performed in a particular order, it should be understood that the order of operations may altered, as appropriate or desired, and that the description is provided only as an example for understanding and not limitation.

Figure 1:
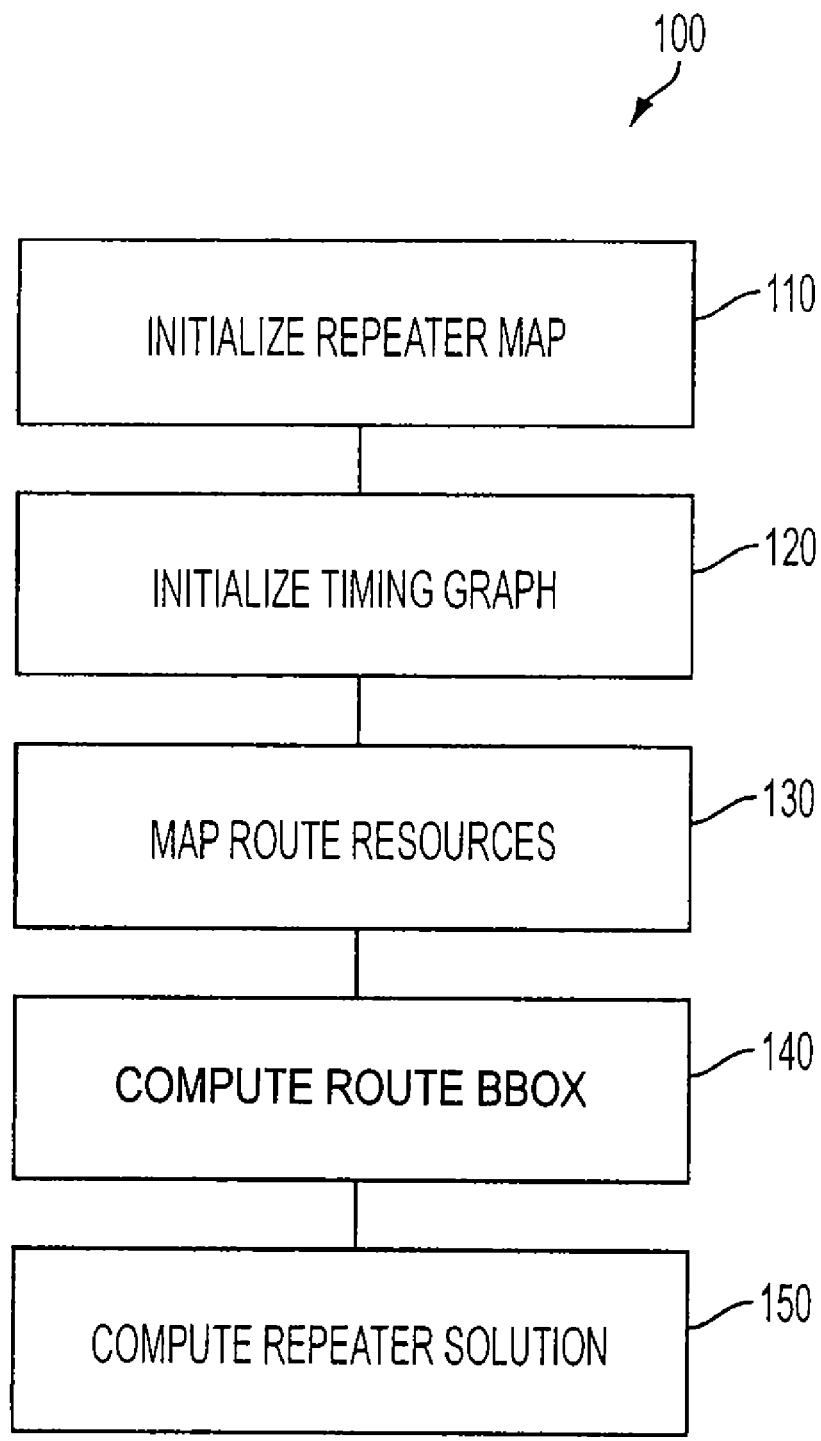
FIG. 1 illustrates an algorithm for use in a pre-route repeater insertion methodology.

For example, the pre-route repeater insertion methodology may be envisioned as an algorithm 100 designed to perform the operations set forth in FIG. 1. The algorithm 100 may begin with a first operation 110 of initializing a repeater map. A second operation 120 of initializing a timing graph may be performed before, during or after the first operation 110. A third operation 130 of mapping route resources may be performed after the first and second operations 110, 120. As discussed below, the third operation 130 may depend on the second operation 120 and may update the repeater map initialized in the first operation 110.

Then, a fourth operation 140 of computing a route BBOX, as known in the art, for each net may be performed. Once a route BBOX is computed for each net, a fifth operation 150 of computing a repeater solution may be performed. As discussed herein, it should be understood that the third, fourth and fifth operations 130, 140 and 150 may be performed iteratively to achieve a complete or final repeater solution.

The first operation 110 may be performed in various ways. The following provides an example of the construct of a repeater map using particular descriptive terms for the sake of understanding. However, it should be understood that the concepts and principles represented by these terms rather than the terms themselves are to be considered to provide an explanation of the features of this operation.

In the first operation 110, a repeater map may be determined by gridding the design into tiles and computing various attributes for each tile. The tiles may be understood as areas defined by x and y distances that subdivide each layer of the design. As such, an independent grid may be determined for each layer of the design. The total area covered by the tiles for each layer should be the area of the design, in whole or in part, for which the method is applied. The size of the individual tiles may be design dependent. For example, the size of the tile may depend on the particular design and/or the computation time. For a given design, smaller tiles will lengthen the computation time because of the greater number of tiles involved. Although the tiles may be different sizes, uniform tile size may simplify the task of dividing the design into tiles.

The attributes computed for each tile relate to repeaters. The attributes may include USAGE, AVAILABILITY, and FREE. USAGE has a non-zero value if repeaters are pre-placed and are wired. All three of these variable attributes may be used together, as described herein, to allow a router to determine whether a wire should be routed through a particular tile if that wire needs a repeater for timing and/or slew reasons in that area of the design. The ranges of possible values for each of these attributes will depend on the actual design.

A non-zero value of USAGE means that the tile is fully or partially used. The value of USAGE is related to AVAIL- ABILITY. AVAILABILITY has a non-zero value if repeaters are pre-placed and are not wired. A non-zero value of AVAILABILITY means that the tile has one or more existing repeaters that are available for use as desired. In one possible implementation, the value of AVAILABILITY of a tile for a particular wire that wants to route through a tile may be equal to the number of repeaters in the tile that the wire can use. In a simplified case, if there are ten pre-placed repeaters in the tile and four of the repeaters are wired, then USAGE may equal four and AVAILABILITY may equal six.

FREE has a non-zero value if it is possible to place a repeater within the bounds of the tile, that is, the title has the capability of having a repeater placed therein. A non-zero value of FREE means that one or more repeaters may be placed within the tile. The value of FREE may depend on the size of the tile and the size of the repeater cell. In one possible implementation, if the tile is large enough for ten repeater cells and no cell of any kind currently occupy the cell, then FREE may equal ten.

The values of FREE and AVAILABILITY may be functions of wire class, as the number of repeaters that may fit within a tile may depend on the wire class and the number of existing repeaters that may be utilized may depend on wire class. For example, assuming a tile with ten pre-placed repeaters and with a size that allows either ten narrow wires of five wide wires to pass through. If eight narrow wires already pass through the tile and are wired to eight of the ten repeaters, then for a ninth narrow wire that wants to route through the tile, AVAILABILITY may be ten minus eight, which equals two. FREE may be zero if the tile has no room for additional repeaters in the tile. However, if the tile already has four wide wires passing through, then for the fifth wide wire that wants to go through, AVAILABILITY may be five minus four, which equals one. If the fifth wire is a narrow wire instead, then AVAILABILITY may equal 2. This is assuming two narrow wire takes the same routing resource as one wide wire (i.e., ten minus (four times two), which equals two). Among other things, wire-class may specify the width of wires.

Further, an obstruction may, as a function of its size, affect the values of FREE and AVAILABILITY differently near the periphery of the obstruction. Also, a usable area of a tile may allow a repeater to be inserted, but no other tile that can be reached from that tile may be available. The effects of obstructions on FREE and AVAILABLE are considerations for a better design. In principle, the design may be gridded into tiles and attributes may be assigned to each tile to help guide the router to accomplish repeater friendly routes before routing is finalized. It should be understood, however, that the range of values or even what values (numerical, alphabetical, or the like) that the attributes may be expressed in may be determined by a particular implementation and/or the design that is being worked on.

The values of FREE and AVAILABILITY may include directional components or indications as well to reflect horizontal or intra-level and vertical or inter-level aspects of a given tile. For example, if the repeater layout uses horizontal access pins (h-pin reps), then typically the repeater layout is accessed by vertical routes. Therefore, ten h-pin reps may yield a value of FREE equal to ten to routes on vertical metal layers, but zero to routes on horizontal metal layers.

The value of FREE may be non-zero even if the area of the title is filled by objects (cells), as long as some of the objects are movable and that tile and/or neighboring tiles can accommodate the movement needed for insertion of a repeater. The only requirement may be that the cell(s) to be moved in the current tile is/are not "fixed." How a cell that is not "fixed" may or may not be moved out of the current tile may be implementation-dependent. In the simplest case, only neighboring tiles may be checked for space into which the cell may be moved. If successful, the value of FREE may be greater than zero; otherwise, the value of FREE may be zero.

Each tile may include other attributes as well, such as those discussed below. Such attributes reflect the repeater resources that an individual tile may have. The repeater resources of each tile may be indicated by the attributes, such as FREE, USAGE, AVAILABILITY. Thus, repeater resources are computed fro each individual tile to provide the repeater map, a data set that includes an identification of tiles, their attributes and their relations to one another. As discussed herein, the attributes may be used to guide routing to help ensure an optimal routing and repeater solution is achieved.

The second operation 120 may also be performed in various ways. The following provides an example of the construct of a timing graph using particular descriptive terms for the sake of understanding. However, it should be understood that the concepts and principles represented by these terms rather than the terms themselves are to be considered to provide an explanation of the features of this operation.

In the second operation 120, a timing graph may be constructed for the overall design. The timing graph describes the behavior of the design in time, providing relationships between points in the design by paths. The timing graph may be constructed, as known in the art, by levelizing the design with timing models that describe the arcs through instances and ports in the design.

The timing graph may be populated with an estimate of the delay (time elapse) for each source-to-sink arc (e.g., path from a driver to a receiver). Certain assumptions may be made at this point: (1) all fanouts are independent of each other; (2) nominal repeater insertion; and, (3) nominal slews at the input of each arc. Arc refers to a timing arc, which physically is a connection, typically point-to-point. The timing arc specifies the timing relationship between points of the connection. Depending on how "critical" the timing arc is, a wire class of higher or lower performance may be assigned. Nominal repeater insertion may be defined using a nominal delay per unit length. Such information may be stored in a look-up table for each wire class. A default wire class, such as a wire class that can route the most connections through a given area on a particular metal layer in the applicable technology, may be used absent a designer's override as the wire class may be unknown at this stage. A table may be used to degrade the computed delay, for example, depending on the number of fanouts and/or other factors a designer may supply, such as, but not limited to, relative criticality, depth in the timing graph, interpolation or extrapolation distance in the table. In general, such factors may be used by a designer to make trade-offs or alterations of given data to "steer" the design in a direction the designer considers to be better.

The design may be timed by following the timing graph. During this process, extreme boundary conditions, such as high setup and/or high arrival time may be overridden. In a mature design, all setup and arrival time should fall within reasonable range of values. However, sometimes when design is evolving, some of the values may be "extreme." In anticipation of design convergence, an assumption may be made that the "extreme" values will be fixed to within a reasonable range. Such "extreme" values may not be appropriate for use in repeater solutions as they may over constrain or force over-design.

Endpoint slacks, that is, the extra time after a signal reaches as endpoint and before the signal is needed at the endpoint, may then be computed. Once the slack is computed, the slack may be apportioned, that is, distributed backwards in the timing graph from each endpoint. Such apportioning or distribution of the slack from each endpoint may be made using a model that is based on wire length, distance (gate-depth) from the endpoint, and fanout. Various ways to distribute slack are known in the art, with strong advocates regarding what works best for a particular design. A simple model, for example, may consider number of gates in the path. For example, if sixty percent of gates are on the source side and forty percent are on the sink side, then sixty percent of the slack may go to the source block.

The default wire class may be selectively adjusted, on a per-arc basis, to a higher wire class if and only if the slack is negative and wire dominant. If a signal is needed at in time equal to 100 ps at an endpoint, but the signal gets there in a time of 120 ps, then the signal may be said to have a negative slack of 20 ps. To get the signal to the endpoint faster, one may upgrade the physical connection to a faster (i.e., higher) wire class. This only makes sense if the wire is a big contributor in the overall delay of the path (i.e., slack is wire dominant).

In the third operation 130 of route resource mapping, a fourth attribute CAPACITY is computed for each tile. The CAPACITY of a tile is a measure of the tile's capacity for wiring or routing. Values for CAPACITY are computed separately for horizontal and vertical directions. Because there is no route at this point, the values of CAPACITY are a function of wire class, whether default or adjusted as discussed above, and direction. If a design only has one wire class for each direction (horizontal, vertical), then CAPACITY may contain two numbers—one for the number of wires that can route through the tile in each direction.

The CAPACITY may be degraded by a percentage as necessary to reflect the state and/or stability of the design, for example, if infrastructure is missing from the design. Assuming the current design has 100K wires, and assuming that the designer knows that before the design is done, the count will increase to 200K wires due to the addition of some features on the chip in the near future. Then, since the value of CAPACITY will influence how many wires to go through each tile, it may be a good idea to "degrade" CAPACITY that so fewer wire goes through each tile. This will leave some room for the yet to be added new wires.

Further, the CAPACITY for a tile may be reduced for the interior area encompassed by very large placement blockages to zero or null. Repeater solutions cannot be found across such large regions. The CAPACITY of tiles including such blockages is nulled to prevent route solutions from considering such areas, even though the layers are available. This addresses the need to remove "gross" obstructions in the repeater solution. For example, for a given layer in a given technology, there may be a maximum distance between repeaters. If repeaters are placed farther apart than the max distance, there will be slew problems. Some areas of the chip may be blocked out completely. If the blocked region exceeds the maximum allowable distances between repeaters, then wires may not be allowed to go through that region because they will certainly violate slew requirements due to the lack of repeaters. The CAPACITY for tiles outside the maximum allowable distance needs to be nulled to avoid wires from going through such regions.

In the fourth operation 140, a Steiner-based route BBOX is computed for each net, as known in the art. The BBOX defines the area that a set of equivalent (in terms of distance) routes can take between two or more points using a chosen wire class. Various examples are discussed below for nets with a single fanout and for nets with multiple fanouts.

Figure 2:
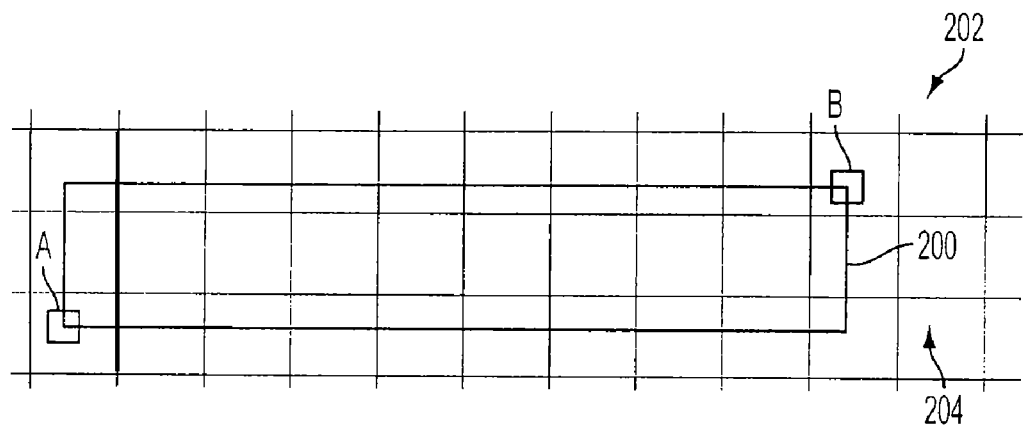
FIG. 2 illustrates an example of a route BBOX for a two-point net with a single fanout.

As illustrated in FIG. 2, a route BBOX 200 will be rectangular for a two-point net consisting of points A and B and having a single fanout. The route BBOX 200 is shown overlaying a grid 202, representing the gridding of the design into tiles 204. The route BBOX 200 may be adjusted, expanded or contracted, according to an amount of positive or negative slack between the points A and B. This allows the route to be degraded, that is, made more scenic, where the timing allows, or ensure that the route is more constrained where timing is tight. Expansion and contraction of the BBOX would result in an increase or reduction, respectively, in the size of the rectangle.

Figure 3:
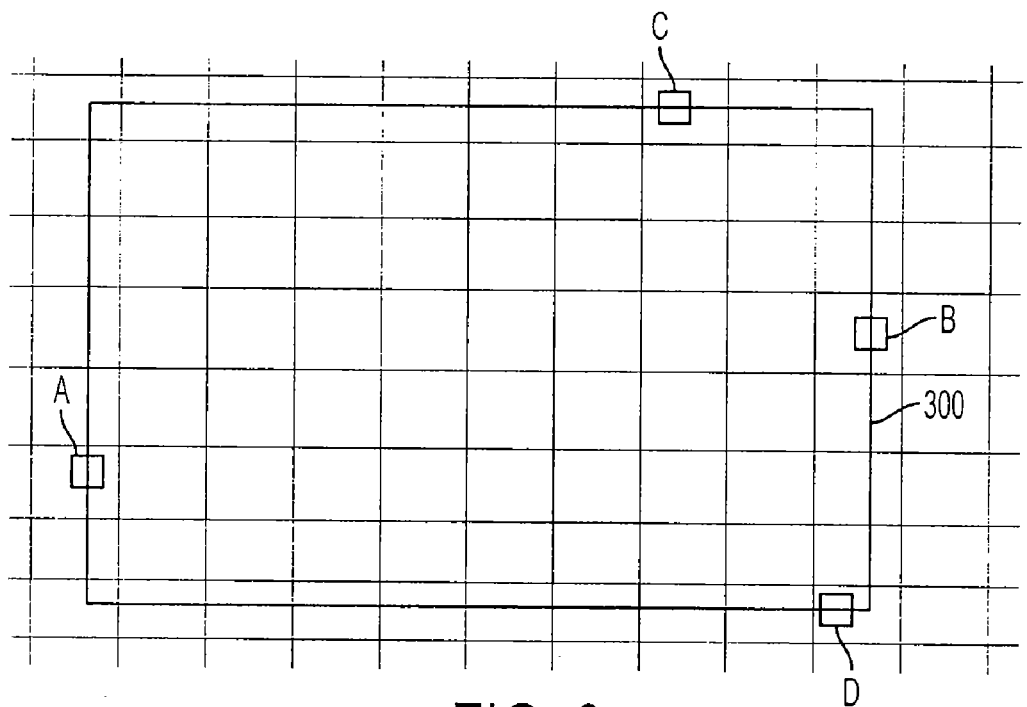
FIG. 3 illustrates an example of a route BBOX for a net with more than two points and a single fanout.

As illustrated in FIG. 3, a route BBOX 300 may also be rectangular for a net consisting of more than two points, such as A, B, C and D, and having a single fanout. The route BBOX 300 shown spans all points A, B, C and D.

For a route BBOX for a net consisting of more than two points and having multiple fanouts, the route BBOX for a corresponding net with a single fanout is trimmed to conform to a Steiner-like route among the points.

Figure 4:
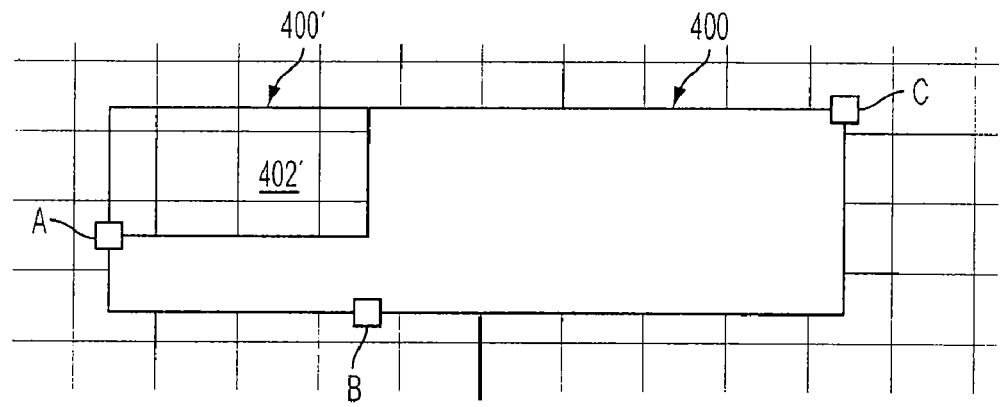
FIG. 4 illustrates an example of a route BBOX for a net with more than two points and multiple fanouts.

For example, as illustrated in FIG. 4, starting with points A, B and C, an initial BBOX 400' is defined that spans all points A, B and C. For a center-driven topology, i.e., fanout from the source, an area 402' is trimmed away to leave a route BBOX 400.

Figure 5:
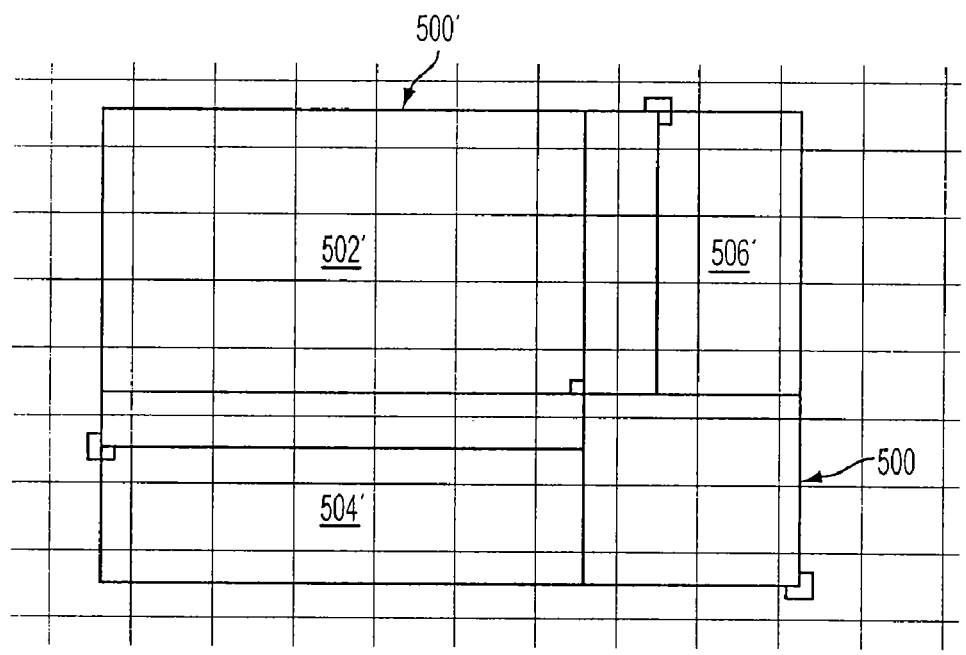
FIG. 5 illustrates another example of a route BBOX for a net with more than two points and multiple fanouts.

Another example shown in FIG. 5, illustrates trimming away of areas 502', 504' and 506' to obtain a route BBOX 500 from an initial BBOX 500'. This is the case for a preference of daisy-chaining from another fanout point rather than the source.

The route BBOX for each net may be adjusted for timing criticality. This may be accomplished by evaluating the timing budget for the node. The "node" refers to the path connected by the source and sink(s). The "timing budget" and evaluation thereof yields the timing slack for the path. If a detour or enlargement of the route BBOX fails to meet the timing budget for the node, then the wire class may be upgraded to improve timing and/or eliminate the detour.

Timing slacks, placement blockages and route resource considerations may be used to drive the route topology, that is, the shape of the route BBOX and the repeater solution concurrently. This will help ensure that routes are repeater friendly and timing convergent.

Another advantage that may be realized in this approach is that the trimming of the route BBOX(es) reduces the size of the solution space. When the trimming is based on a directed graph, the reduction of the solution space simplifies finding a repeater solution.

The route BBOX for each net may be adjusted for routing obstructions. An obstruction may require one or more detours from a line-of-sight or straight line to get from one point to another. For example, if a line-of-sight directed line crosses an obstruction that cannot be crossed by wire class (e.g., layer usage restriction), the path may be constructed as a series of segments around the obstruction.

Figure 6A:
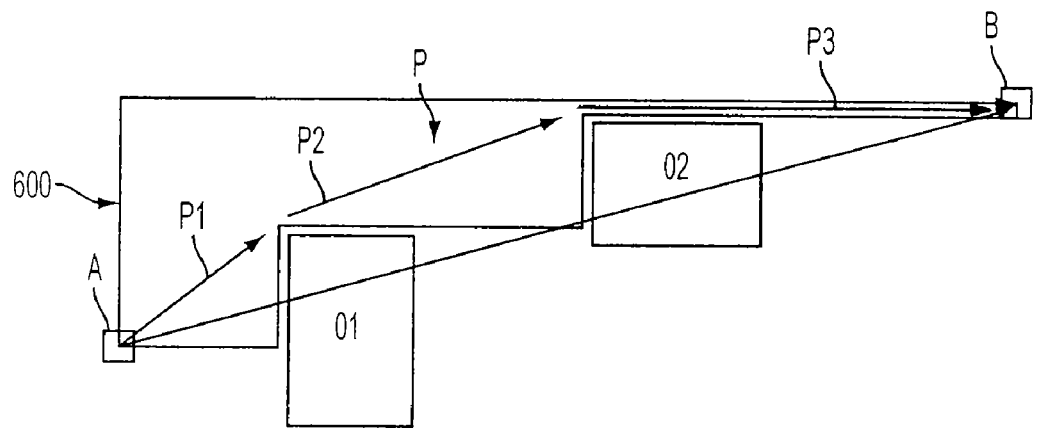
FIG. 6A illustrates an example of a route BBOX adjusted for routing obstructions.
Figure 6B:
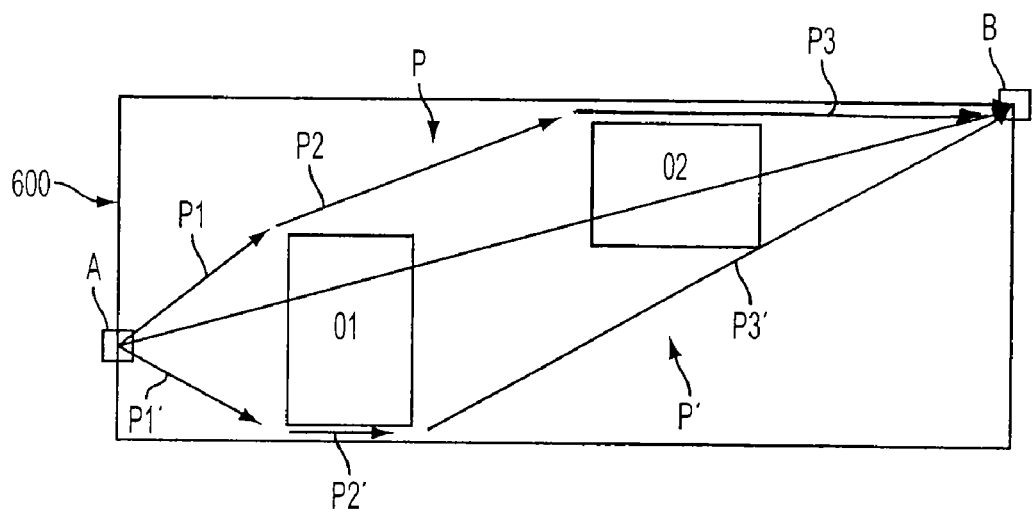
FIG. 6B illustrates another example of a route BBOX adjusted for routing obstructions.

As illustrated in FIGS. 6A and 6B, a detour path P consisting of segments P1, P2 and P3 may be constructed around obstructions O1 and O2. The route BBOX 600 is trimmed accordingly. Another detour path P' consisting of segments P1', P2' and P3' may be constructed around obstructions O1 and O2 as well as long as expansion of the route BBOX 600 to that shown in FIG. 6B is enabled by slack timing.

If multiple detours are possible, then the detour may be selected as determined by the path of least cost during computation of the repeater solution, as discussed below. This is a useful way in which repeater placement (i.e., complete repeater solution as opposed to pre-placed repeaters) prior to routing may lead to timing closure faster than post-route repeater insertion methodologies. For example, a conventional router may simply chose the lower detour path P' as a function of congestion, rather than making a timing aware choice, and may create a timing violation that would not be recognized until much later.

Because the pre-route repeater methodology is timing aware, the placement obstructions may be considered in a conservative manner. In other words, placement obstructions may be enabled to influence the route BBOX in a conservative manner. Routes that can take detours may be encouraged so that the (limited) repeater sites around the placement obstructions will be reserved fro routes that must "fly over" the placement obstructions because of timing constraints. If needed, the timing graph may be revisited to adjust the slack allocations to alleviate such concerns. By adjusting slack at different points of the timing graph, the route BBOX may be expanded/contracted to enable more choices.

Figure 7A:
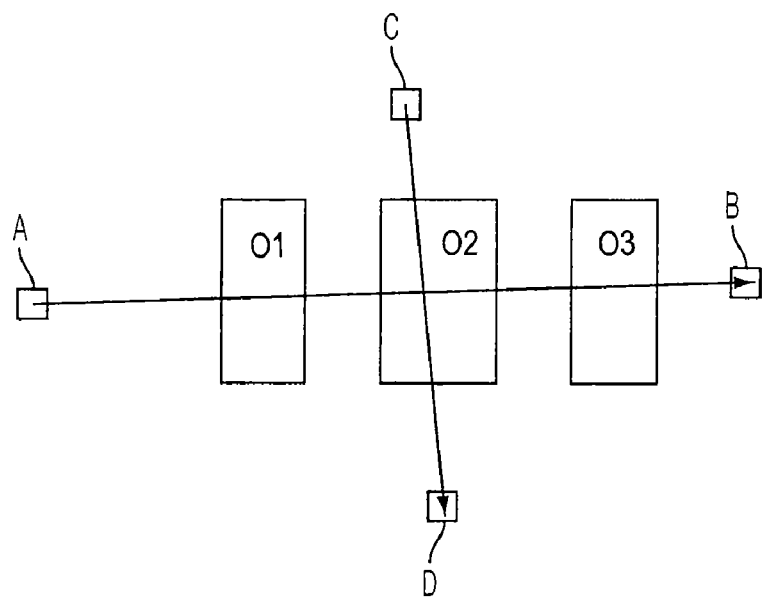
FIG. 7A illustrates an example of a two routes affected by placement obstructions.
Figure 7B:
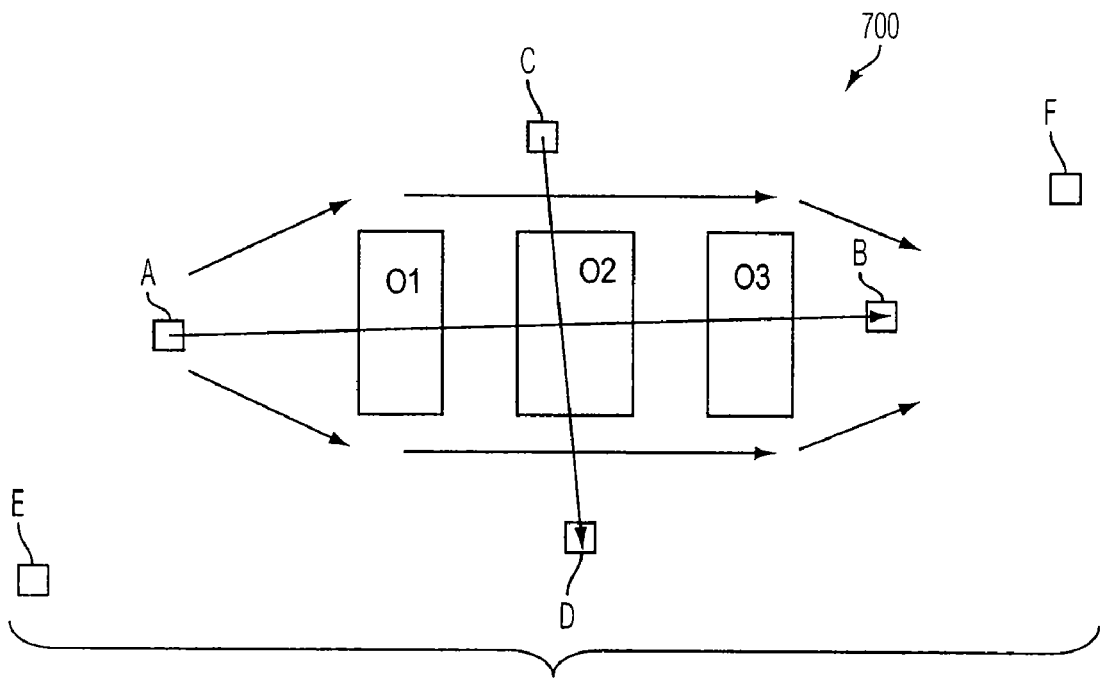
FIG. 7B illustrates the example of FIG. 7A with detouring of the horizontal routes and an area constructed for routes over or through a congested region.

For example, as illustrated in FIGS. 7A and 7B, placement obstructions O1, O2 and O3 may affect two routes that need repeaters, from A to B being horizontal and from C to D being vertical. Assuming that the allowed distance between repeater stages is greater than the horizontal width of the obstructions O1, O2, O3, but less than their height. Consequently, the horizontal routes must avoid the obstructions O1, O2, O3, while the vertical routes can run over the obstructions O1, O2, O3. Higher priority to repeaters must be given to the vertical routes in this case.

This may be facilitated by encouraging the horizontal routes to detour around the obstructions O1, O2, O3, provided that the timing constraints permit such detour. Longer routes should be detoured completely away from this congested area, and presumably can because of little or no impact on the overall time-distance in detouring. As illustrated in FIG. 7B, 700 represents an area that would be constructed for a route over or through the congested region, for example, as between points E and F. A path from point E to point F may go through area 700 to avoid the obstructions O1, O2 and O3, through which no route can pass.

In the fifth operation 150, a repeater solution may be computed. Once a route BBOX is determined for each net, a NEED attribute may be computed within the BBOX for each tile from the CAPACITY and the information now known about the design, namely, the probability of wire(s) occupying any tile within the BBOX. The value of NEED represents the relative amount of wiring that wants to use that tile. Tiles with higher values of NEED may be thought of as being more congested. Thus, tiles with higher values of NEED should discourage repeater insertion within such tiles, because repeater insertion further increases route congestion as wires generally need to descend from higher metal layers on which they are routed down to the repeater input pin (usually on lower metal layers) and then return back to the higher route layer from the output pin of the repeater.

The NEED value may be weighted for any given net in any given tile according to any one of a number of currently existing algorithms. For example, the NEED of the tile containing any of the endpoints is known to be the highest. Near the pin tiles, that is, tiles that contain a pin where a pin is an access point for an object to connect objects together in a design, the probability of use is higher than father away from the pin tiles. All tiles sufficiently far away, which will be design dependent, from the pin tiles may be viewed as having roughly the same probability of use (within the route BBOX). Further, preference may be given to tiles through which the optimal Steiner route is graphed. In other words, a tile with a lower NEED value may be preferred for repeater placement(s).

As pins are access points for connecting objects, routing is performed from pin to pin. Thus, pin tiles have relatively high demands for routing resources. The idea is to have the NEED attribute value set higher for pin tiles so that repeaters are less likely to be placed in pin tiles and consume routing resources. Using a higher or "weighted" NEED value may preserve the routing resources for routes that need access to the pins. Thus, as described herein, the tile attributes may be used to control repeater placement.

The algorithm for determining the "weighted" value of the NEED attribute of a pin tile may be as simple as multiplying the NEED value by a multiplier greater than one. It should be understood that the multiplier value may be design dependent. The idea is not to justify an optimal multiplier, or an optimal distance from pins. Rather tiling a design and assigning attributes to each tile as described herein may provide flexibility in controlling repeater placement.

Figure 8:
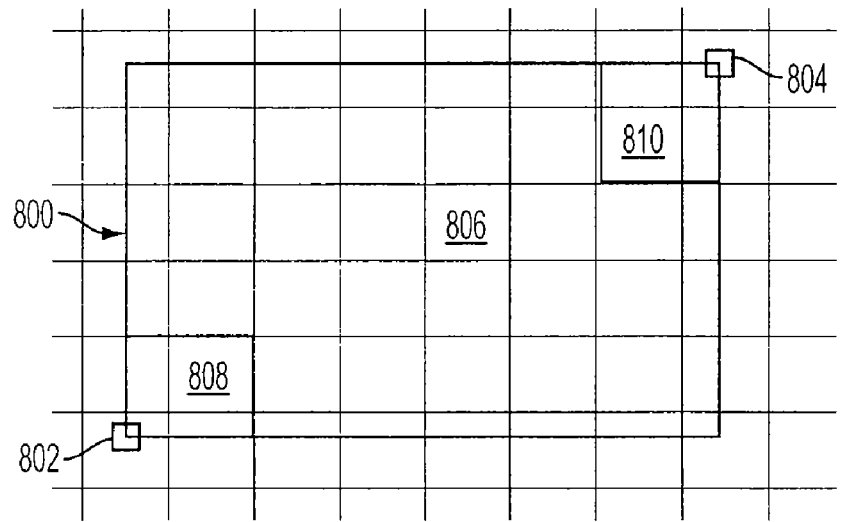
FIG. 8 illustrates an example of a route BBOX for a two-pin node with a NEED attribute determined for tiles.

As an example, a two-pin node, pins 802 and 804, is illustrated in FIG. 8. The horizontal NEED and the vertical NEED are determined separately. A simple algorithm may be applied that the interior horizontal NEED is the reciprocal of the number of tiles in the height of the route BBOX 800, and that the interior vertical NEED is the reciprocal of the BBOX's width. These values may be used for the tiles in area 806, while a higher value of NEED is used for the tiles in areas 808 and 810 because they are near the pins 802 and 804, respectively.

The NEED may be viewed as the probability of use by the router, because there is no actual route at this time. The relative differences in NEED across the different tiles—and collectively for all nets of the design—are reflected to help determine the repeater solution. The higher the NEED, the more costly it will be to use a given tile for repeater insertion.

Wire class may also be applied as a scaling function against the NEED values. A net in a wire class that needs more wiring resource (width and space) has a higher intrinsic NEED value than one that requires less wiring resource. As understood in the art, wires of different width and/or spacing may be classified into different wire classes. A tile may have enough space for ten relatively narrow wires, but only five relatively wider wires. In such case, if the five wider wires want to go through a tile for the design, the NEED may be 5*2=10. The NEED should be the same for ten narrower wires, 10*1=10. In this example, the scaling function may be applied as a "scaling factor" of 2 for the wider wire class and 1 for the narrower wire class.

Because the value of NEED is, by definition, directly correlated to the dimensions of the route BBOX, increasing the size of the route BBOX reduces the NEED. This is one way in which the pre-route repeater insertion methodology may factor in timing criticality. As the routing BBOX is the area over which wires travel, if there are ten wires and the BBOX is relatively small, then it may be likely that one tile within the BBOX area will have to accommodate multiple wires and the NEED may be greater than one. If the BBOX area is relatively large, then it may be likely that each tile inside the BBOX area will have to accommodate only one wire or no wires and the NEED may be between zero and one. Thus, a larger BBOX area will reduce the NEED value.

Figure 9A:
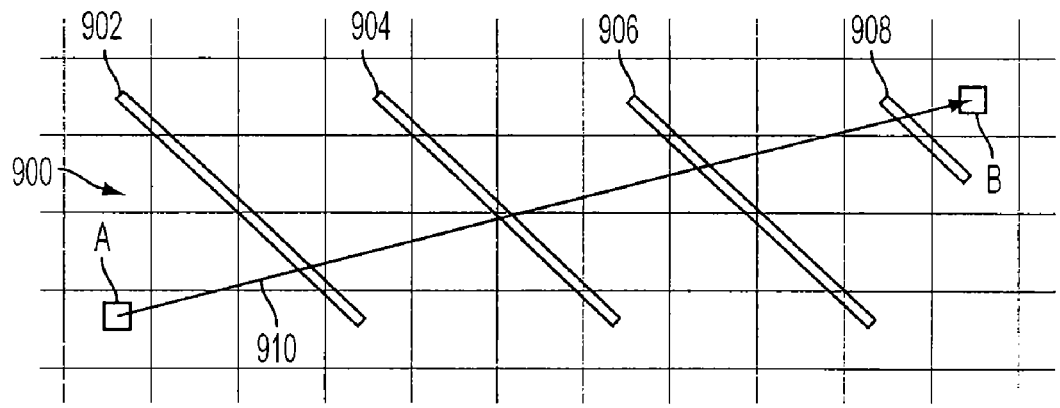
FIG. 9A illustrates an example of a route BBOX for a two-pin node with repeater wave windows/lines computer therein.
Figure 9B:
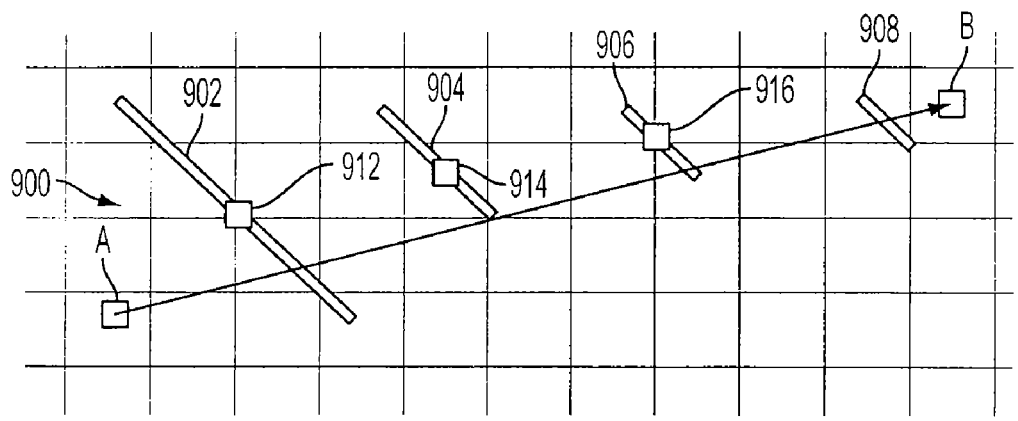
FIG. 9B illustrates the example of FIG. 9A with placement of repeaters.

Based on the analysis of the relative degree of NEED for each tile in the route BBOX, repeater placement selection may proceed without actual routing. For each net, repeater wave windows may be computed within the route BBOX area 900, as illustrated in FIGS. 9A and 9B. From any given point A or B (either upstream or downstream), a wave window is a set of points that are all a certain route distance away from the reference point. The route distance is the nominal distance between two repeaters as defined in a lookup table for the wire class of the net. The waves are lines 902, 904, 906, 908, not arcs, due to the Manhattan nature of routing.

While all points on a wave line are equivalent with respect to the reference point, they are not equivalent if iterating across more than one wave. A line 910 between endpoints A and B may define a "best" point (intersection point) on each wave line 902, 904, 906, 908 to use. The line 910 represents one of the many potential wave paths that travel from the source A to the sink B. All the wave paths in the wave window may be found by hopping from each tile on the initial wave line 902 to the nearest tile on the next wave line 904, and continue until the sink B is reached. For example, as shown in FIG. 9B, points 912, 914 and 916 illustrate one example of where one would land on each respective wave line 902, 904 and 906 hopping from one wave line to the next on the path from A to B.

From the timing graph initialize in operation 120, the timing characteristics of each wave path for the net from source A to sink B. Then, a subset of the wave paths is selected that meets the timing constraints for the current net for which a repeater solution is being sought. FIG. 9B illustrates where repeaters 912, 914, 916 may be placed on the wave path 910, close to the "best" point on each wave line 902, 904, 906, 908.

Figure 10A:
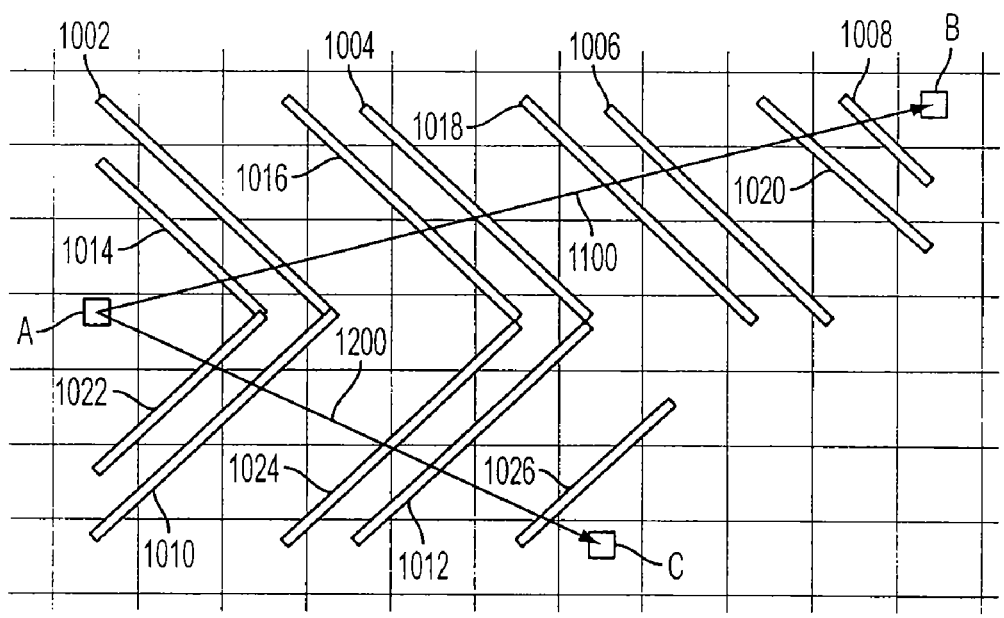
FIG. 10A illustrates an example of a route BBOX for a net with multiple fanouts, with repeater wave windows/lines computer therein.
Figure 10B:
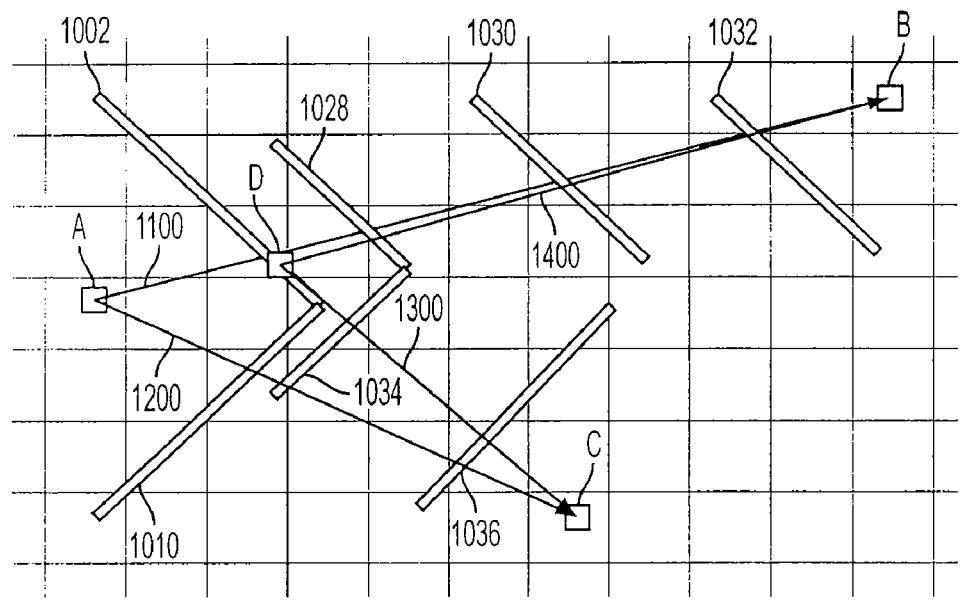
FIG. 10B illustrates the example of FIG. 10A with a commonality and divergence in wave paths.
Figure 10C:
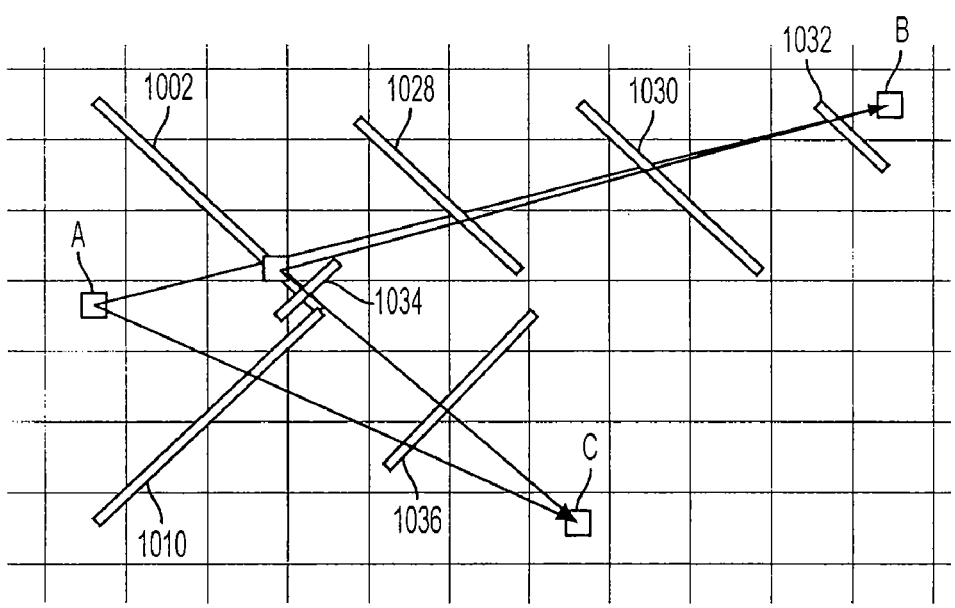
FIG. 10C illustrates the example of FIG. 10B one endpoint being more critical than the other endpoint and a point of divergence.

When there are multiple fanouts, there may be more than one wave window propagating from a particular reference point. As illustrated in FIGS. 10A, 10B and 10C, if the waves propagate in the same general direction, their commonality may be sought, if it exists, and if the constraints on the solution allow. If not, the distance from the reference point that the wave windows may initially occur may be reduced, as shown.

Specifically, FIG. 10A shows wave lines 1002, 1004, 1006, 1008, 1010, 1012 that represent the original wave windows, that is, a first set of wave windows that may not be optimize and may be modified. Wave lines 1014, 1016, 1018, 1020, 1022, 1024, 1026 represent the wave windows if there is no commonality that may be used for both of the sinks B and C. Note that the first wave lines 1014, 1022 have a reduced length, as defined by a number of points where a repeater may be placed on a given wave window, than wave lines 1002 and 1010. The amount or degree of reduction may be based on slew constraints defined for the wire class of the net, as well as other route considerations. As indicated by the arrows in FIG. 10A, point A is a driver and points B and C are sinks. The distance from any point on a wave window to the driver A cannot be arbitrarily large. In other words, wave windows must be sufficiently short so that every point thereon where a repeater may be placed will not be too far from the driver A. The distance or "how far is to far" will be design and technology dependent. In this case, both sets of wave lines are consistent with wave paths 1100 and 1200, that is, both paths 1100 and 1200 travel through the respective set of wave windows/lines from driver A to respective sinks B and C.

FIG. 10B shows a case where the wave paths 1100, 1200 share a first wave point along wave lines 1002, 1010, and then diverge from a point of divergence D. Wave paths 1300 and 1400 are updated between the point of divergence D and the sinks B and C. Note that the positioning of the wave lines at the point of divergence is not necessarily balanced between the endpoints B and C. Instead, the positioning may be weighted, first by the timing criticality of the endpoints B and C, and second by the availability of repeater-ready tiles, that is, tiles that are capable and appropriate for repeater insertion. In the example of FIG. 10B, preference was given to sink B in placement of the first repeater at the point of divergence D, and wave lines 1034, 1036 were updated for the endpoint C as being less critical than the endpoint B.

Using the concepts of wave windows and wave lines, the less critical endpoint's wave lines 1034, 1036 may be moved closer to the point of divergence D to allow the more critical endpoint's wave lines 1002, 1028, 1030, 1032 to move father away from the point of divergence D, as illustrated in FIG. 10C. This may or may not reduce the number of needed repeaters to the more critical endpoint B, possibly at the expense of less repeaters to the less critical endpoint C.

For nets with more than one fanout, the pre-route repeater insertion methodology may be configured to steer the repeater solution toward the most critical fanout for all phases of determining the repeater solution. Thus, even though multiple wave windows may be considered, the approach (or algorithm) may always prioritize the wave window associate with the most critical fanout to an extent determined by the slack of the particular fanout. For example, if the slack is positive, repeater re-use will be favored. If the slack is negative at one or more points of the fanout, repeater re-use may be a lower priority. Point D in FIG. 10B is an example of repeater re-use. If a repeater is placed at point D, that repeater may be used to drive signals to both sinks B and C, assuming paths 1400 and 1300 are chosen.

Higher fanout nets, such as nets where one driver is driving four or more sinks, may justify special attention. For example, some manner of clustering as a precursor to wave window computation may be employed. Clustering may serve to reduce the effective fanout that the driver/source "sees" and may limit the number of wave windows and/or lines that are considered. The clustering may be based on locality and timing to achieve a goal of balance among similarly timing critical nodes or endpoints, but imbalance in favor of the nodes with the most timing criticality. Thus, the clusters of nodes may be ranked based on such factors. Further, differently ranked clusters of nodes may not generally be mixed together during formation of a repeater tree, a well-known technique in the art. For example, U.S. Pat. No. 5,648, 911, which is incorporate by reference herein in its entirety, describes a method of minimizing area for fanout chains in high-speed networks.

In other words, before constructing the wave windows for nets with relatively high fanouts, it may be desirable to group (e.g., cluster) the end points together as much as possible or practical. Doing so may yield a more optimized repeater tree for the wave windows for the paths to reach all endpoints from the driver.

Based on the wave window created for repeater placement as discussed above, the repeater placement may be refined with a power optimization at this stage of the repeater solution computation. As mentioned above, an optimal power solution depends on the timing slack involved in a given path, wherein the objective is to provide signal travel from one point to another point as fast as needed while achieving a relatively great or maximum power efficiency.

For each net, the following operations may be performed. The timing graph may be re-initialized as discussed above in operation 120. Beginning with a default repeater drive strength, the repeater drive strength may be reduced or sized down as appropriate. For example, the timing graph may be evaluated along the wave paths for the net to determine the timing slack in the wave paths. The slack that can be eliminated for power savings may be the actual timing slack of the wave path reduced by a margin of desirable over-design. The margin of over-design may be determined as appropriate or desired, for example, to address any tool inaccuracies and/or process variations that may exist.

For tiles in the wave path where timing slack exists, the potential power savings may be computed as a value of an attribute PSAVE for each tile. The potential power savings may be computed by down-sizing the repeater drive strength while maintaining timing and/or slew requirements. This may involve iterating the design through analyses of the timing graph to find an optimal repeater drive strength for that tile on the wave path. The PSAVE attribute values are specific to a wave path and are saved as attribute values only for the tiles on that wave path. In other words, not all tiles of the design may include a PSAVE attribute or value therefore.

At this point, the following has been accomplished for each net in the design: (1) construction of a route BBOX that is adjusted in size by timing constraints, adjusted in shape by the number of fanouts, and adjusted to accommodate route detours due to placement obstructions, which interfere with repeater placements; (2) within the route BBOX, computation of the NEED attribute of each tile, which reflects routing congestion resulting from BBOXes for all the nets in the area (e.g., overlapping BBOXes); (3) creation or generation of wave windows, made up of wave lines, from the route BBOX, with the wave windows and the wave lines being adjusted to accommodate or account for timing criticality if the net includes multiple fanouts; (4) selection of wave paths for each source-sink pair in the net that transverses the wave lines and meet timing constraints, with the tiles on the selected wave paths providing potential repeater placement locations; and, (5) calculation, for each wave path, of potential power savings for each tile on the wave path while maintaining timing criticality of the net.

The repeater placements may be finalized or completed to determine a repeater solution by choosing a wave path from among all wave paths in the wave window for the particular net. The choice may be made by: (1) selecting wave path(s) that include tiles with non-zero value(s) of AVAILABILITY and/or FREE attributes, which are tiles that have available pre-placed repeaters, such as pre-placed repeater banks or free space to allow insertion of an additional repeater, respectively; (2) for the case of more than one wave path being so selected, selecting wave paths that include tiles with a lowest value of the NEED attribute to spread out routing/avoid routing congestion; and, (3) for the case of more than one path remaining, select the wave path that includes tiles with the highest potential power savings according to the respective values of the PSAVE attribute.

As discussed above, several advantages may be realized through implementation of a pre-route repeater insertion methodology as described herein. One advantage may be that any need to rip-up and reroute for a repeater solution may be diminished or even avoided because a repeater solution is found before routing. Another advantage may be that the potential for creating scenic paths and/or lower QoR in a design may be reduced.

The concept of using tile attributes to guide repeater insertion may allow various embodiments described herein to work with existing route and/or existing repeaters in a design while still providing a pre-route repeater solution before routing is completed.

Embodiments described herein may enable wire class and timing constraints to be leveraged to find an improved or optimal wire class solution for each net while finding a repeater solution. Further, embodiments described herein may enable a path's timing slack to be leveraged to improve or even optimize power characteristics while finding a repeater solution.

Embodiments described herein may also reduce routing congestion in a design by considering congestion issues while finding a repeater solution, and, when possible, routing away from congested areas to help ensure route closure.

By placing repeaters before routing, an increase in a number of nets may be offset by a smaller design area covered by each net. This may help improve later detailed routing performance and run-time for the design, as well as achieve simpler and/or less time-consuming closure for the design.

It is also contemplated that aspects described herein may be implements as a computer-readable storage medium. Such a storage medium may include, but is not limited to, a hard-drive, a floppy diskette, a CD-ROM, RAM, flash memory, optical or magnetic storage media, etc. As such, the term computer-readable storage medium should be understood to encompass all physical structures that are configured to store instructions that, when executed by a computer, will cause the computer to perform certain operations.

Although the present invention has been described with respect to particular embodiments and operations, it should be understood that changes to the described embodiments and/or operations may be made and yet still embraced by alternative embodiments of the invention. For example, the figures are provided for purposes of illustration only and not limitation. As such, embodiments in addition to the specific examples provided are contemplated, as supported by the broad disclosure provided herein.

What is claimed is:

1. A method of performing a pre-route repeater insertion methodology for at least part of a circuit design, the method comprising:
    partitioning, utilizing a processor, at least part of a circuit design into a plurality of tiles, the circuit design comprising a plurality of levels;
    determining at least one intra-level attribute of one or more individual tiles of the plurality of tiles, the intra-level attribute related to one level of the circuit design;
    determining at least one inter-level attribute of the one or more individual tiles of the plurality of tiles, the inter-level attribute related to a portion of the plurality of levels of the circuit design; and
    determining a repeater solution based at least in part on the determined attributes of the one or more individual tiles.

2. The method of claim 1, further comprising determining a power solution based at least in part on the determined attributes of the one or more individual tiles while determining the repeater solution.

3. The method of claim 2, wherein at least one of the attributes of the one or more individual tiles is a PSAVE attribute.

4. The method of claim 1, further comprising determining at least part of a route topology based at least in part on the determined attributes of the one or more individual tiles while determining the repeater solution.

5. The method of claim 1, wherein at least one of the attributes of the one or more individual tiles is a USAGE attribute.

6. The method of claim 1, wherein at least one of the attributes of the one or more individual tiles is an AVAILABILITY attribute.

7. The method of claim 1, wherein at least one of the attributes of the one or more individual tiles is a FREE attribute.

8. The method of claim 1, wherein at least one of the attributes of the one or more individual tiles is a CAPACITY attribute.

9. The method of claim 1, wherein at least one of the attributes of the one or more individual tiles is a NEED attribute.

10. A computer-readable storage medium including stored instructions that, when executed by a computer, cause the computer to perform a pre-route repeater insertion methodology for at least part of a circuit design by:
  partitioning at least part of a circuit design into a plurality of tiles, the circuit design comprising a plurality of levels;
  determining at least one intra-level attribute of one or more individual tiles of the plurality of tiles, the intra-level attribute related to one level of the circuit design;
  determining at least one inter-level attribute of the one or more individual tiles of the plurality of tiles, the inter-level attribute related to a portion of the plurality of levels of the circuit design; and
  outputting a repeater solution based at least in part on the determined attributes of the one or more individual tiles.

11. The computer-readable storage medium of claim 10, further including stored instructions that, when executed by the computer, cause the computer to:
  determine a power solution based at least in part on the determined attributes of the one or more individual tiles while determining the repeater solution.

12. The computer-readable storage medium of claim 11, wherein the stored instructions that, when executed by the computer, cause the computer to determine at least one attribute of one or more individual tiles of the plurality of tiles comprise instructions that cause the computer to determine a PSAVE attribute as at least one of the attributes of the one or more individual tiles.

13. The computer-readable storage medium of claim 10, further including stored instructions that, when executed by the computer, cause the computer to:
  determine at least part of a route topology based at least in part on the determined attributes of the one or more individual tiles while determining the repeater solution.

14. The computer-readable storage medium of claim 10, wherein the stored instructions that, when executed by the computer, cause the computer to determine at least one attribute of one or more individual tiles of the plurality of tiles comprise instructions that cause the computer to determine a USAGE attribute as at least one of the attributes of the one or more individual tiles.

15. The computer-readable storage medium of claim 10, wherein the stored instructions that, when executed by the computer, cause the computer to determine at least one attribute of one or more individual tiles of the plurality of tiles comprise instructions that cause the computer to determine a AVAILABILITY attribute as at least one of the attributes of the one or more individual tiles.

16. The computer-readable storage medium of claim 10, wherein the stored instructions that, when executed by the computer, cause the computer to determine at least one attribute of one or more individual tiles of the plurality of tiles comprise instructions that cause the computer to determine a FREE attribute as at least one of the attributes of the one or more individual tiles.

17. The computer-readable storage medium of claim 10, wherein the stored instructions that, when executed by the computer, cause the computer to determine at least one attribute of one or more individual tiles of the plurality of tiles comprise instructions that cause the computer to determine a CAPACITY attribute as at least one of the attributes of the one or more individual tiles.

18. The computer-readable storage medium of claim 10, wherein the stored instructions that, when executed by the computer, cause the computer to determine at least one attribute of one or more individual tiles of the plurality of tiles comprise instructions that cause the computer to determine a NEED attribute as at least one of the attributes of the one or more individual tiles.

19. A computer-implemented tool for performing a pre-route repeater insertion methodology for at least part of a circuit design, the tool comprising:
  a module configured to partition at least part of a circuit design into a plurality of tiles, the circuit design comprising a plurality of levels;
  a module configured to determine at least one intra-level attribute of one or more individual tiles of the plurality of tiles, the intra-level attribute related to one level of the circuit design;
  a module configured to determine at least one inter-level attribute of the one or more individual tiles of the plurality of tiles, the inter-level attribute related to a portion of the plurality of levels of the circuit design and
  a module configured to determine a repeater solution based at least in part on the determined attributes of the one or more individual tiles.

20. The computer-implemented tool of claim 19, further comprising a module configured to determine a power solution based at least in part on the determined attributes of the one or more individual tiles while determining the repeater solution.

* * * * *